United States Patent
Shih

(10) Patent No.: US 12,470,228 B2
(45) Date of Patent: Nov. 11, 2025

(54) SIGNAL RECEIVING CIRCUIT AND CALIBRATION METHOD THEREOF

(71) Applicant: REALTEK SEMICONDUCTOR CORPORATION, Hsinchu (TW)

(72) Inventor: Yi-Chang Shih, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 186 days.

(21) Appl. No.: 18/414,501

(22) Filed: Jan. 17, 2024

(65) Prior Publication Data

US 2024/0267054 A1    Aug. 8, 2024

(30) Foreign Application Priority Data

Feb. 7, 2023 (TW) .................................. 112104244

(51) Int. Cl.
  *H03M 1/10*    (2006.01)
(52) U.S. Cl.
  CPC ....... *H03M 1/1019* (2013.01); *H03M 1/1023* (2013.01)
(58) Field of Classification Search
  CPC .......... H03M 1/10; H03M 1/19; H03M 1/1023
  See application file for complete search history.

(56) References Cited

U.S. PATENT DOCUMENTS

| | | | | |
|---|---|---|---|---|
| 7,310,058 B2* | 12/2007 | Udupa | ................. | H03M 1/168 341/122 |
| 7,933,361 B2* | 4/2011 | Huang | ................. | H03G 3/3068 375/345 |
| 8,218,686 B1* | 7/2012 | Timofeev | ............. | H04L 25/062 327/307 |
| 8,773,190 B2 | 7/2014 | Mueller et al. | | |
| 9,319,057 B1* | 4/2016 | Pandey | ............ | H04L 25/03057 |
| 9,407,276 B1* | 8/2016 | Coban | ................. | H03M 1/1009 |
| 10,312,930 B1* | 6/2019 | Byrne | .................. | H03F 3/2175 |
| 10,630,303 B1* | 4/2020 | Wang | ...................... | H03M 1/66 |
| 10,693,485 B1* | 6/2020 | Zhang | .................... | H04B 1/10 |
| 10,862,498 B1* | 12/2020 | Chen | .................. | H03M 1/1033 |

(Continued)

OTHER PUBLICATIONS

OA letter of a counterpart TW application (appl. No. 112104244) mailed on Oct. 15, 2024.

(Continued)

*Primary Examiner* — Lam T Mai
(74) *Attorney, Agent, or Firm* — WPAT, PC

(57) ABSTRACT

A signal receiving circuit receives an input signal and includes a radio frequency (RF) front-end circuit, a filter circuit, an amplifier circuit, an analog-to-digital converter (ADC), a compensation circuit, an adder circuit, and a control circuit. The RF front-end circuit down-converts the input signal to generate a down-converted signal. The filter circuit filters the down-converted signal to generate a filtered signal. The amplifier circuit amplifies, according to a control signal, the filtered signal with a gain to generate an amplified signal. The ADC converts the amplified signal into a first digital code. The compensation circuit generates a compensation code according to at least one of the control signal and the gain. The adder circuit generates a second digital code according to the compensation code and the first digital code. The control circuit generates the control signal according to the second digital code.

9 Claims, 10 Drawing Sheets

(56) References Cited

U.S. PATENT DOCUMENTS

| | | | | |
|---|---|---|---|---|
| 10,868,559 B1* | 12/2020 | Huang | | H03M 1/74 |
| 11,206,157 B1* | 12/2021 | Hung | | H04L 25/03885 |
| 12,388,456 B2* | 8/2025 | Wang | | H03M 1/164 |
| 2001/0054974 A1* | 12/2001 | Wright | | H03F 1/3247 |
| | | | | 341/144 |
| 2005/0073450 A1* | 4/2005 | Kim | | H03M 1/0621 |
| | | | | 341/119 |
| 2005/0153676 A1* | 7/2005 | Ruelke | | H03D 3/008 |
| | | | | 455/324 |
| 2007/0080835 A1* | 4/2007 | Maeda | | H03D 3/009 |
| | | | | 341/120 |
| 2008/0048903 A1* | 2/2008 | Kimura | | H03G 3/3078 |
| | | | | 341/155 |
| 2009/0040084 A1* | 2/2009 | Frederick | | H04B 1/403 |
| | | | | 341/122 |
| 2011/0227770 A1* | 9/2011 | Kaper | | H03M 1/1052 |
| | | | | 341/145 |
| 2011/0312334 A1* | 12/2011 | Yajima | | G01S 19/24 |
| | | | | 455/456.1 |
| 2017/0155399 A1* | 6/2017 | Tsai | | H03M 1/462 |
| 2018/0212570 A1* | 7/2018 | Zhu | | H03F 1/0233 |
| 2019/0158111 A1* | 5/2019 | Hsieh | | H03M 3/436 |
| 2021/0135692 A1 | 5/2021 | De Ruijter et al. | | |
| 2023/0299799 A1* | 9/2023 | Tanaka | | H04L 7/06 |
| | | | | 455/552.1 |
| 2024/0137032 A1* | 4/2024 | Kim | | H04B 1/06 |

OTHER PUBLICATIONS

Fengjie Wang et al., "An effective DC offset calibration method combined with analog and digital circuits for direct conversion receivers", IEICE Electronics Express, vol. 16, No. 19, 1-6, 2019 The Institute of Electronics, Information and Communication Engineers.

* cited by examiner

| Ctrl_I/Ctrl_Q | GA_I/GA_Q (dB) | DC offset (mV) | Cp_I/Cp_Q (LSB) |
|---|---|---|---|
| 00 | 0 | 5 | -5 |
| 01 | 6 | 10 | -10 |
| 10 | 12 | 20 | -20 |
| 11 | 18 | 40 | -40 |

FIG. 3

| Ctrl_I/Ctrl_Q | GA_I/GA_Q (dB) | DC offset (mV) | Cp_I/Cp_Q (LSB) |
|---|---|---|---|
| 00 | 0 | 5 | -5 (+1) |
| 01 | 6 | 10 | -10 (+1) |
| 10 | 12 | 20 | -20 (+1) |
| 11 | 18 | 40 | -40 (+1) |

FIG. 4

SIGNAL RECEIVING CIRCUIT AND CALIBRATION METHOD THEREOF

BACKGROUND OF THE INVENTION

1. Field of the Invention

The present invention generally relates to signal receiving circuits, and, more particularly, to the calibration of signal receiving circuits.

2. Description of Related Art

A wireless device (e.g., a wireless network (Wi-Fi) device, Bluetooth device) usually includes a receiving circuit to receive input signals, and the receiving circuit usually includes an analog-to-digital converter (ADC) to convert the input signal into a digital code. FIG. 1 shows the conversion curve of a conventional ADC. The straight line 102 represents the ideal analog-to-digital conversion. The stepped solid line 104 represents the output of the ideal ADC. The stepped dotted line 106 represents the output of the actual ADC. Due to the direct current (DC) offset in the receiving circuit, there is an error between the stepped solid line 104 and the stepped dotted line 106 (in the example of FIG. 1, the error is one least significant bit (LSB)), resulting in a decrease in linearity. This unwanted DC offset may come from the ADC itself or from other components of the receiving circuit. Therefore, DC offset (or error) compensation is an important issue in this technical field.

SUMMARY OF THE INVENTION

In view of the issues of the prior art, an object of the present invention is to provide a signal receiving circuit and a calibration method thereof, so as to make an improvement to the prior art.

According to one aspect of the present invention, a signal receiving circuit is provided. The signal receiving circuit is configured to receive an input signal and includes a radio frequency (RF) front-end circuit, a filter circuit, an amplifier circuit, an analog-to-digital converter (ADC), a compensation circuit, an adder circuit, and a control circuit. The RF front-end circuit is configured to down-convert the input signal to generate a down-converted signal. The filter circuit is coupled to the RF front-end circuit and configured to filter the down-converted signal to generate a filtered signal. The amplifier circuit is coupled to the filter circuit and configured to amplify, according to a control signal, the filtered signal with a gain to generate an amplified signal. The ADC is coupled to the amplifier circuit and configured to convert the amplified signal into a first digital code. The compensation circuit is coupled to the amplifier circuit and configured to generate a compensation code according to at least one of the control signal and the gain. The adder circuit is coupled to the compensation circuit and the ADC and configured to generate a second digital code according to the compensation code and the first digital code. The control circuit is coupled to the amplifier circuit and the adder circuit and configured to generate the control signal according to the second digital code.

According to another aspect of the present invention, a method of calibrating a signal receiving circuit is provided. The signal receiving circuit includes an amplifier circuit and an ADC. The ADC is configured to convert an output signal of the amplifier circuit to generate a first digital code. The method includes the following steps: generating a control signal according to a second digital code, the control signal being used to control a gain of the amplifier circuit; generating a compensation code according to at least one of the control signal and the gain; and generating the second digital code according to the compensation code and the first digital code.

The technical means embodied in the embodiments of the present invention can solve at least one of the problems of the prior art. Therefore, compared to the prior art, the present invention can improve the linearity of the signal receiving circuit.

These and other objectives of the present invention no doubt become obvious to those of ordinary skill in the art after reading the following detailed description of the preferred embodiments with reference to the various figures and drawings.

BRIEF DESCRIPTION OF THE DRAWINGS

FIG. 3 shows a look-up table according to an embodiment of the present invention.

FIG. 4 shows a look-up table according to another embodiment of the present invention.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a signal receiving circuit and a calibration method thereof. On account of that some or all elements of the signal receiving circuit could be known, the detail of such elements is omitted provided that such detail has little to do with the features of this disclosure, and that this omission nowhere dissatisfies the specification and enablement requirements. Some or all of the method of calibrating the signal receiving circuit may be implemented by software and/or firmware and can be performed by the signal receiving circuit or its equivalent. A person having ordinary skill in the art can choose components or steps equivalent to those described in this specification to carry out the present invention, which means that the scope of this invention is not limited to the embodiments in the specification.

Figure 1:
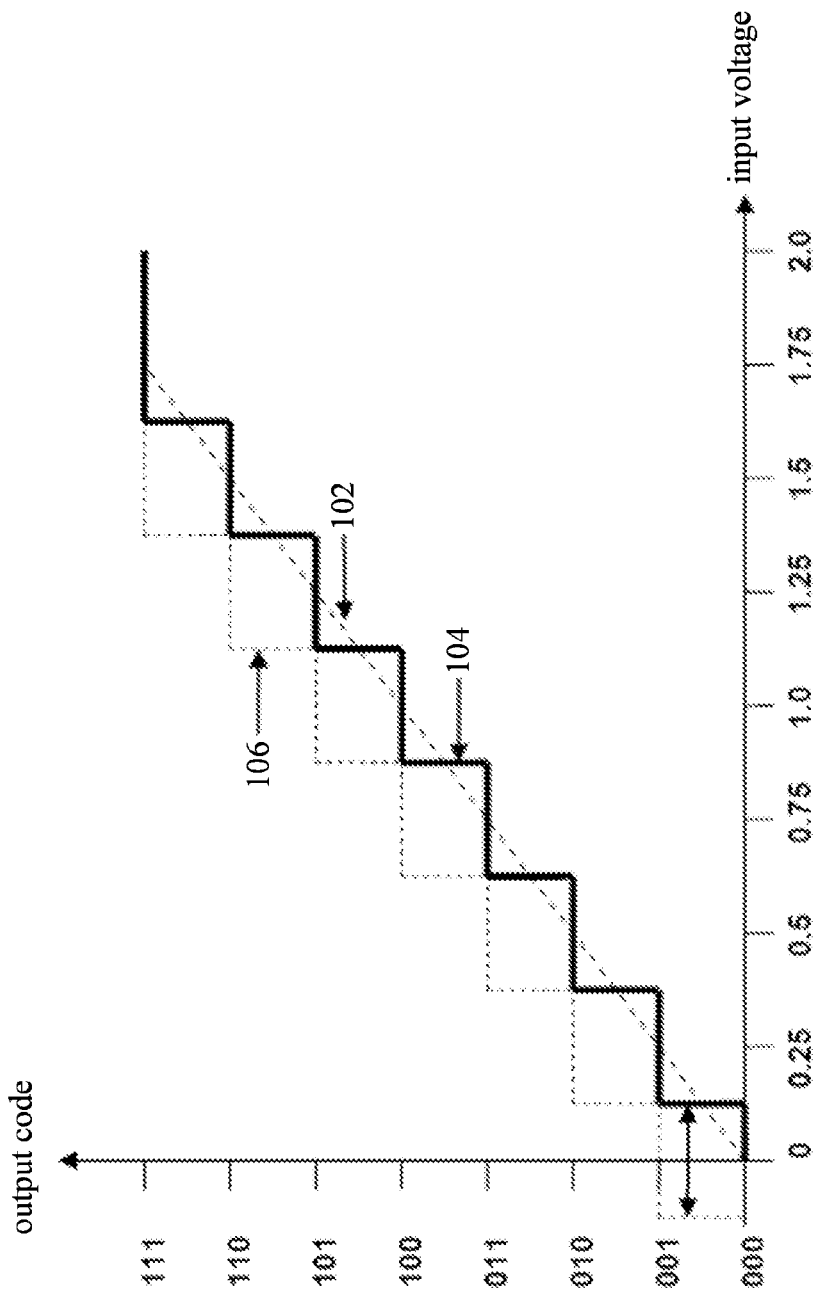
FIG. 1 shows the conversion curve of a conventional analog-to-digital converter (ADC).
Figure 2:
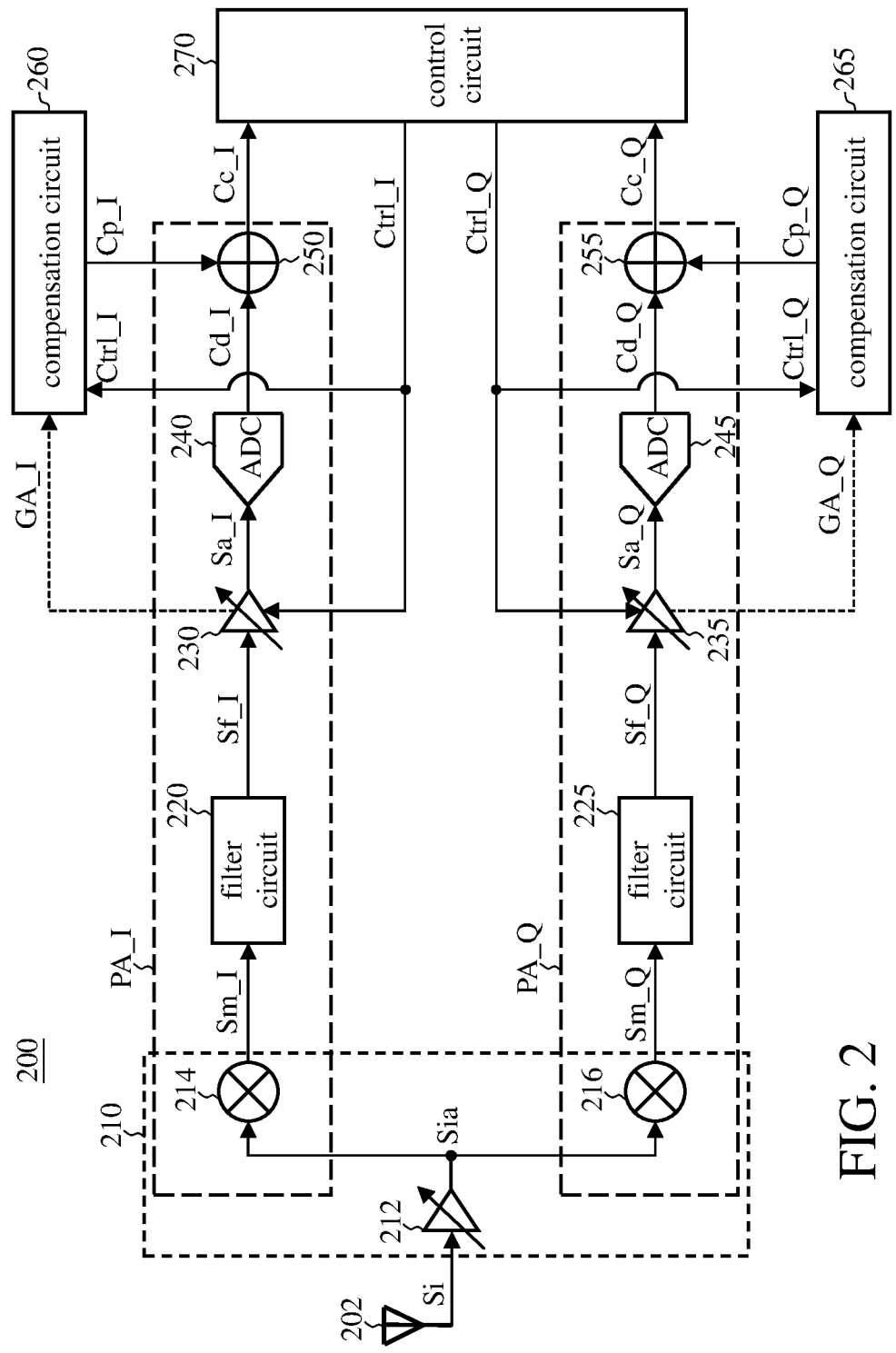
FIG. 2 is a functional block diagram of a signal receiving circuit according to an embodiment of the present invention.

FIG. 2 is a functional block diagram of a signal receiving circuit according to an embodiment of the present invention. The signal receiving circuit 200 includes a low noise amplifier (LNA) 212, a mixer 214, a mixer 216, a filter circuit 220, a filter circuit 225, an amplifier circuit 230, an amplifier circuit 235, an analog-to-digital converter (ADC) 240, an ADC 245, an adder circuit 250, an adder circuit 255, a compensation circuit 260, a compensation circuit 265, and control circuit 270. The radio frequency (RF) front-end circuit 210 includes the LNA 212, the mixer 214, and the mixer 216. The in-phase path PA_I of the signal receiving circuit 200 includes the mixer 214, the filter circuit 220, the amplifier circuit 230, the ADC 240, and the adder circuit 250. The quadrature path PA_Q of the signal receiving circuit 200 includes the mixer 216, the filter circuit 225, the amplifier circuit 235, the ADC 245, and the adder circuit 255. The amplifier circuit 230 and the amplifier circuit 235 may be embodied by a programmable gain amplifier (PGA).

The signal receiving circuit 200 receives the input signal Si through the antenna 202. The RF front-end circuit 210 down-converts the input signal Si to generate a down-converted signal Sm_I and a down-converted signal Sm_Q. More specifically, the LNA 212 amplifies the input signal Si to generate an amplified signal Sia. The mixer 214 mixes the amplified signal Sia with a first local oscillation signal (not shown) to generate the down-converted signal Sm_I. The mixer 216 mixes the amplified signal Sia with a second local oscillation signal (not shown) to generate the down-converted signal Sm_Q.

The filter circuit 220 (the filter circuit 225) is coupled or electrically connected to the mixer 214 (the mixer 216) and configured to filter the down-converted signal Sm_I (the down-converted signal Sm_Q) to generate a filtered signal Sf_I (a filtered signal Sf_Q) (e.g., in the frequency band of interest or the frequency band to be processed).

The amplifier circuit 230 (the amplifier circuit 235) is coupled or electrically connected to the filter circuit 220 (the filter circuit 225) and configured to amplify the filtered signal Sf_I (the filtered signal Sf_Q) with a gain GA_I (a gain GA_Q) according to the control signal Ctrl_I (the control signal Ctrl_Q) to generate an amplified signal Sa_I (an amplified signal Sa_Q). More specifically, the control circuit 270 adjusts the gain GA_I (the gain GA_Q) of the amplifier circuit 230 (the amplifier circuit 235) through the control signal Ctrl_I (the control signal Ctrl_Q) according to the digital code Cc_I (the digital code Cc_Q). For example, when the energy (or amplitude) of the digital code Cc_I (the digital code Cc_Q) is small (large), the control circuit 270 controls the amplifier circuit 230 (the amplifier circuit 235) to increase (decrease) the gain GA_I (the gain GA_Q). The technical means of determining the energy (or amplitude) of a digital signal in the digital domain are well known to people having ordinary skill in the art, and the details are omitted for brevity.

The ADC 240 (the ADC 245) is coupled or electrically connected to the amplifier circuit 230 (the amplifier circuit 235) and configured to convert the amplified signal Sa_I (the amplified signal Sa_Q) into a digital code Cd_I (a digital code Cd_Q).

The compensation circuit 260 (the compensation circuit 265) is coupled or electrically connected to the control circuit 270 and configured to generate a compensation code Cp_I (a compensation code Cp_Q) according to the gain GA_I (the gain GA_Q) and/or the control signal Ctrl_I (the control signal Ctrl_Q). Because the amplifier circuit 230 (the amplifier circuit 235) adjusts the gain GA_I (the gain GA_Q) according to the control signal Ctrl_I (the control signal Ctrl_Q), the generation of the compensation code Cp_I (the compensation code Cp_Q) according to the gain GA_I (the gain GA_Q) is equivalent to the generation of the compensation code Cp_I (the compensation code Cp_Q) according to the control signal Ctrl_I (the control signal Ctrl_Q).

In some embodiments, the compensation circuit 260 (the compensation circuit 265) includes a look-up table circuit and uses the gain GA_I (the gain GA_Q) (or the control signal Ctrl_I (the control signal Ctrl_Q)) as an index to look up in the table to generate the compensation code Cp_I (the compensation code Cp_Q).

In the following discussion, the in-phase path PA_I is used as an example.

Reference is made to FIG. 3 which is an embodiment of the look-up table according to an embodiment of the present invention. For example, when the control signal Ctrl_I is "01," the amplifier circuit 230 amplifies the filtered signal Sf_I by six dB. When the gain GA_I is six dB, the direct current (DC) offset (10 mV) of the amplifier circuit 230 will cause the digital code Cd_I to shift by 10 least significant bits (LSBs). Therefore, the corresponding compensation code Cp_I outputted by the compensation circuit 260 is −10 LSBs to compensate the amplifier circuit 230 for its DC offset. It can be seen from FIG. 3 that the greater the gain GA_I, the greater the DC offset of the amplifier circuit 230.

The adder circuit 250 adds the digital code Cd_I and the compensation code Cp_I to generate the digital code Cc_I (i.e., the amplifier circuit 230 is compensated for its DC offset by the adjustment of the digital code Cd_I). The digital code Cc_I and the digital code Cc_Q are compensated digital codes.

In summary, the present invention uses the compensation circuit 260 (the compensation circuit 265) to compensate the amplifier circuit 230 (the amplifier circuit 235) for its DC offset to improve the linearity of the signal receiving circuit 200. In other embodiments, if there is a DC offset in the mixer 214 (the mixer 216) and/or the filter circuit 220 (the filter circuit 225), a current digital-to-analog converter (IDAC) may be used to compensate for or calibrate the DC offset(s). Using an IDAC to compensate for or calibrate the DC offset is well known to people having ordinary skill in the art, and the details are omitted for brevity.

Reference is made to FIG. 4 which is a look-up table according to another embodiment of the present invention. Compared to FIG. 3, the compensation code Cp_I of FIG. 4 further takes the DC offset of the ADC 240 into account. That is to say, the compensation circuit 260 (or the compensation code Cp_I) can simultaneously compensate the amplifier circuit 230 and the ADC 240 for their DC offsets. More specifically, in the example of FIG. 4, the DC offset of the ADC 240 results in a decrement of one LSB in the digital code Cd_I. Therefore, the compensation circuit 260 compensates the ADC 240 for its DC offset by adding one LSB to the compensation code Cp_I.

Figure 5:
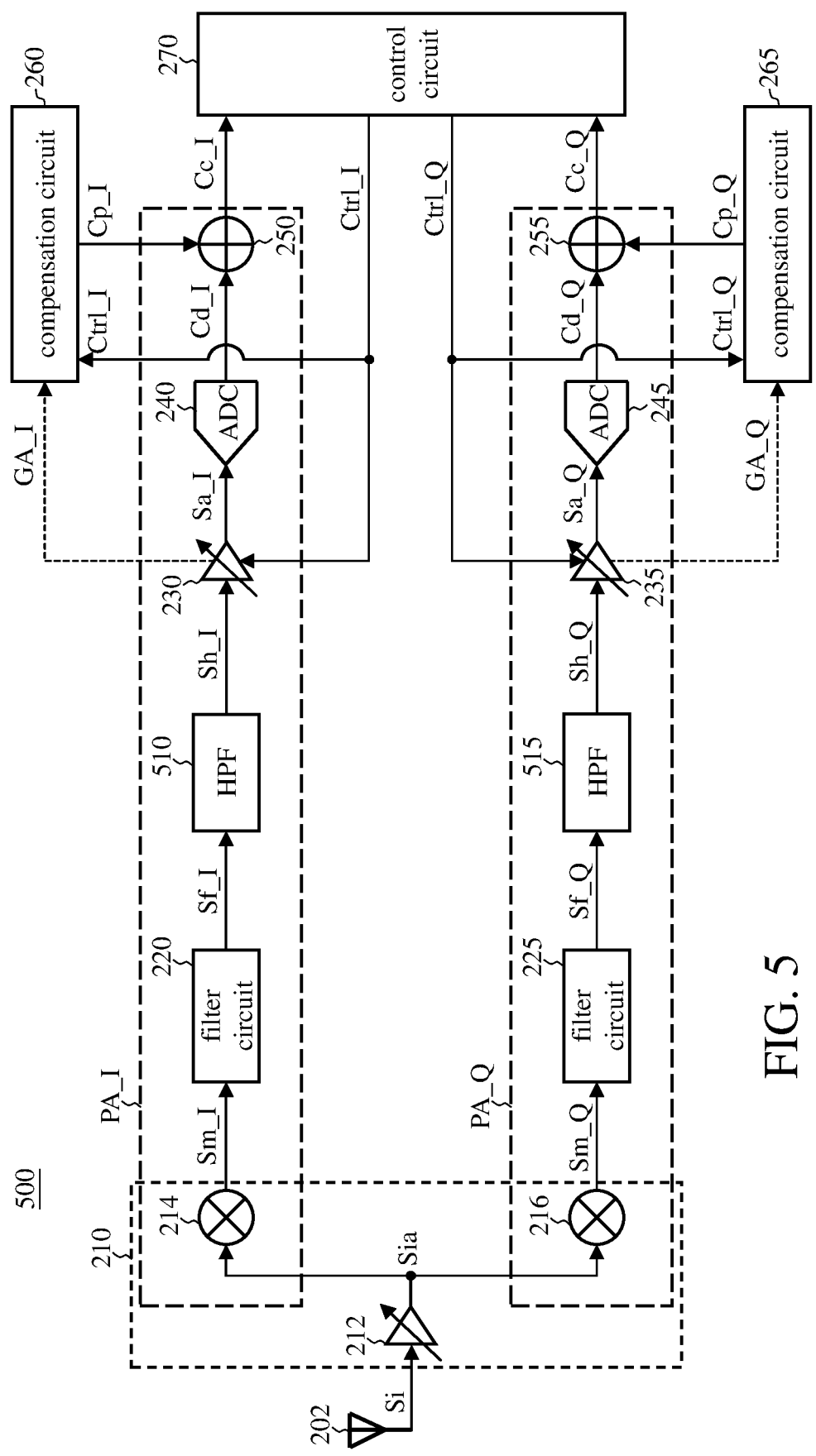
FIG. 5 is a functional block diagram of a signal receiving circuit according to another embodiment of the present invention.

FIG. 5 is a functional block diagram of a signal receiving circuit according to another embodiment of the present invention. The signal receiving circuit 500 is similar to the signal receiving circuit 200, but the signal receiving circuit 500 further includes a high-pass filter (HPF) 510 arranged on the in-phase path PA_I and an HPF 515 arranged on the quadrature path PA_Q. The HPF 510 (the HPF 515) high-pass filters the filtered signal Sf_I (the filtered signal Sf_Q)

to generate a high-pass filtered signal Sh_I (a high-pass filtered signal Sh_Q). The amplifier circuit 230 (the amplifier circuit 235) is coupled or electrically connected to the HPF 510 (the HPF 515) and configured to amplify the high-pass filtered signal Sh_I (the high-pass filtered signal Sh_Q) to generate the amplified signal Sa_I (the amplified signal Sa_Q).

Taking the in-phase path PA_I as an example, the HPF 510 can filter out the DC offset(s) of the mixer 214 and/or the filter circuit 220, preventing the DC offset(s) from causing the amplified signal Sa_I to exceed the dynamic range of the ADC 240. In some circumstances, the use of the HPF 510 eliminates the need for an IDAC used to compensate the mixer 214 and/or the filter circuit 220.

Figure 6:
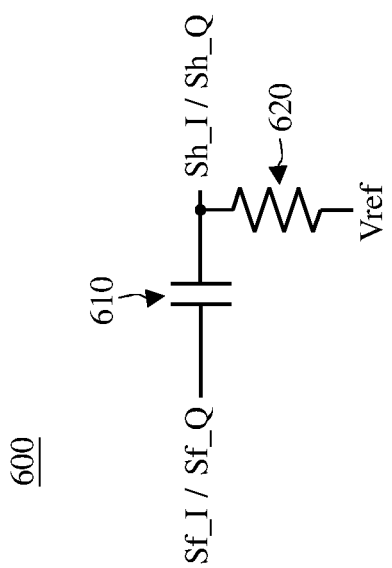
FIG. 6 is a circuit diagram of a high-pass filter (HPF) according to an embodiment of the present invention.

FIG. 6 is a circuit diagram of an HPF according to an embodiment of the present invention. The HPF 600 is an alternating current (AC) coupling circuit including a capacitor 610 and a resistor 620. The first end of the capacitor 610 is coupled or electrically connected to the filter circuit 220 (the filter circuit 225), and the second end of the capacitor 610 is coupled or electrically connected to the amplifier circuit 230 (the amplifier circuit 235). The first end of the resistor 620 is coupled or electrically connected to the second end of the capacitor 610, and the second end of the resistor 620 is coupled or electrically connected to a reference voltage Vref (which, for example, may be half of the power supply voltage of the signal receiving circuit 500).

Figure 7:
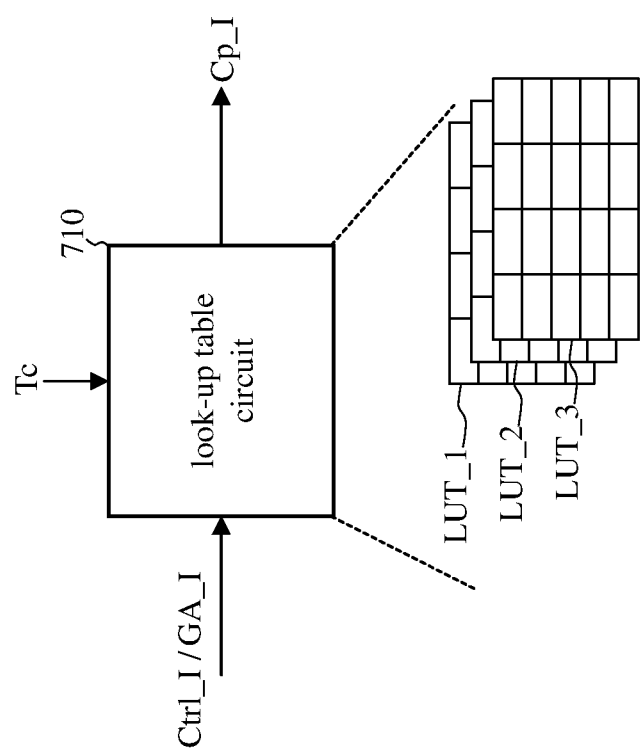
FIG. 7 is a schematic diagram of a look-up table circuit according to an embodiment of the present invention.

FIG. 7 is a schematic diagram of the look-up table circuit according to an embodiment of the present invention. Taking the in-phase path PA_I as an example, the look-up table circuit 710 generates the compensation code Cp_I according to the control signal Ctrl_I (or the gain GA_I) and a piece of temperature information Tc. More specifically, the look-up table circuit 710 includes a plurality of look-up tables (e.g., the look-up table LUT_1, the look-up table LUT_2, and the look-up table LUT_3), each look-up table corresponding to one piece of temperature information (e.g., the look-up table LUT_1, the look-up table LUT_2, and the look-up table LUT_3 correspond to 15° C., 25° C. and 30° C. respectively). The look-up table circuit 710 selects a corresponding look-up table according to the current temperature (i.e., the piece of temperature information Tc), and then uses the selected look-up table to generate the compensation code Cp_I. In an alternative embodiment, the compensation circuit 260 and the compensation circuit 265 of FIG. 3 and FIG. 5 may be embodied by the look-up table circuit 710. In one embodiment, the piece of temperature information Tc can be obtained from the temperature coefficient of a transistor (e.g., a bipolar junction transistor (BJT)) in a temperature detection circuit (not shown). The use of the temperature coefficient of the transistor to detect the piece of temperature information Tc is well known to people having ordinary skill in the art, and the details are omitted for brevity.

Figure 8:
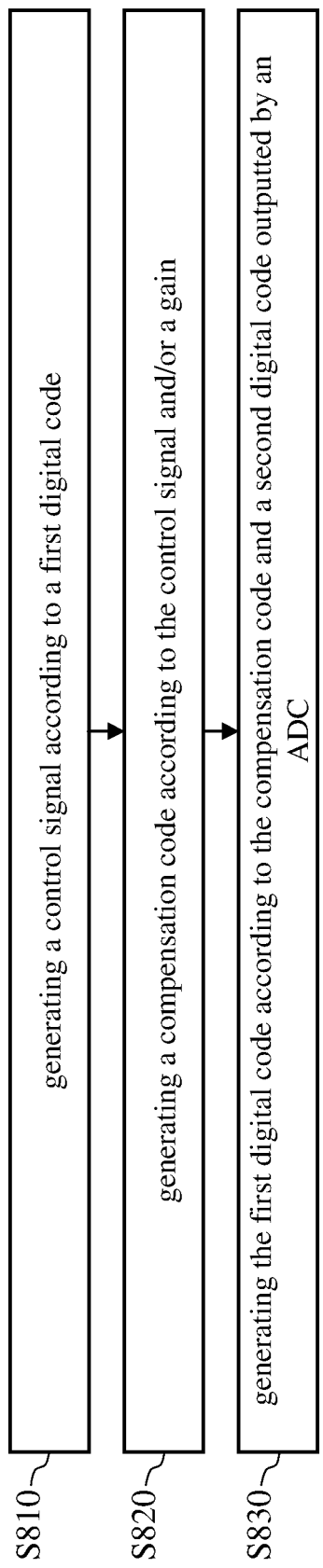
FIG. 8 is a flowchart of a method of calibrating a signal receiving circuit according to an embodiment of the present invention.

In addition to the signal receiving circuit 200 and the signal receiving circuit 500, the present invention also discloses a corresponding method of calibrating a signal receiving circuit to compensate the signal receiving circuit for its DC offset or to correct the DC offset. This method is executed by the signal receiving circuit 200, the signal receiving circuit 500, or their equivalent devices. FIG. 8 is a flowchart of the method of calibrating the signal receiving circuit according to an embodiment of the present invention. The flowchart includes the following steps.

Step S810: The control circuit 270 generates the control signal Ctrl_I according to the first digital code (the digital code Cc_I). The control signal Ctrl_I is used to control the gain GA_I of the amplifier circuit 230.

Step S820: The compensation circuit 260 generates the compensation code Cp_I according to the control signal Ctrl_I and/or the gain GA_I.

Step S830: The adder circuit 250 generates the first digital code (the digital code Cc_I) according to the compensation code Cp_I and the second digital code (the digital code Cd_I) outputted by the ADC 240.

Figure 9:
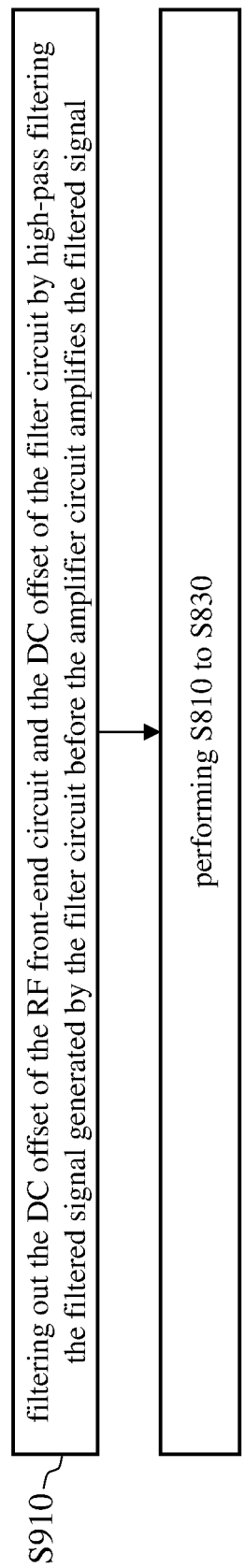
FIG. 9 is a flowchart of a method of calibrating a signal receiving circuit according to another embodiment of the present invention.

FIG. 9 is a flowchart of a method of calibrating the signal receiving circuit according to another embodiment of the present invention. FIG. 9 corresponds to FIG. 5 and includes the following steps.

Step S910: filtering out the DC offset of the RF front-end circuit 210 and/or the DC offset of the filter circuit 220 by high-pass filtering the filtered signal Sf_I generated by the filter circuit 220 before the amplifier circuit 230 amplifies the filtered signal Sf_I.

Figure 10:
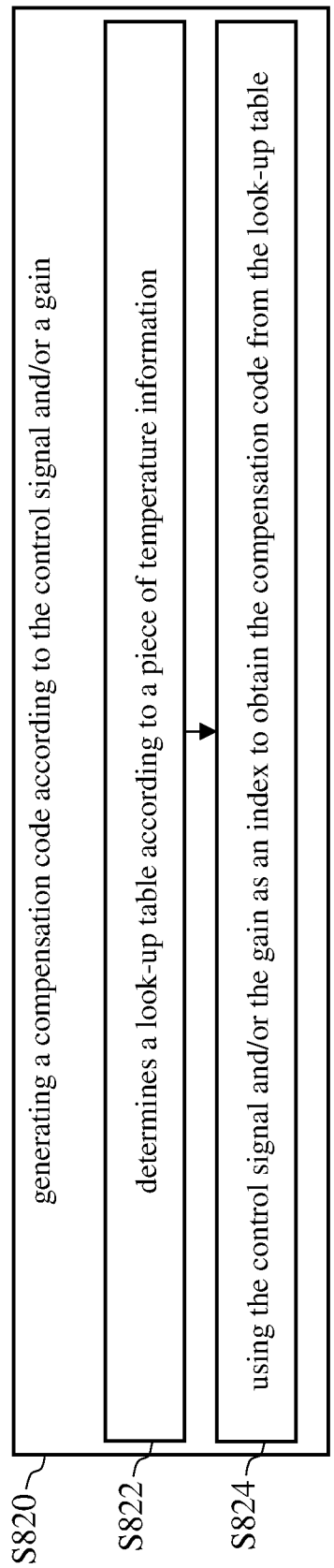
FIG. 10 is a detailed flow of step S820 in FIG. 8 according to an embodiment.

FIG. 10 is a detailed flow of step S820 in FIG. 8 according to an embodiment, including the following sub-steps.

Step S822: The compensation circuit 260 determines a look-up table according to a piece of temperature information Tc. Please refer to the discussion in relation to FIG. 7.

Step S824: The compensation circuit 260 uses the control signal Ctrl_I and/or the gain GA_I as an index to obtain the compensation code from the look-up table. Please refer to the discussion in relation to FIG. 3 or FIG. 4.

In summary, the present invention calibrates the signal receiving circuit by compensating for and/or filtering out the DC offset on the signal receiving circuit. People having ordinary skill in the art can implement the control circuit 270 with digital circuits or logic circuits based on the above discussion.

Since a person having ordinary skill in the art can appreciate the implementation detail and the modification thereto of the present method invention through the disclosure of the device invention, repeated and redundant description is thus omitted. Note that the shape, size, and ratio of any element in the disclosed figures are exemplary for understanding, not for limiting the scope of this invention. Furthermore, there is no step sequence limitation for the method inventions as long as the execution of each step is applicable. In some instances, the steps can be performed simultaneously or partially simultaneously.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A signal receiving circuit configured to receive an input signal, the signal receiving circuit comprising:
    a radio frequency (RF) front-end circuit configured to down-convert the input signal to generate a down-converted signal;
    a filter circuit coupled to the RF front-end circuit and configured to filter the down-converted signal to generate a filtered signal;
    an amplifier circuit coupled to the filter circuit and configured to amplify, according to a control signal, the filtered signal with a gain to generate an amplified signal;
    an analog-to-digital converter (ADC) coupled to the amplifier circuit and configured to convert the amplified signal into a first digital code;

a compensation circuit coupled to the amplifier circuit and configured to generate a compensation code according to at least one of the control signal and the gain;

an adder circuit coupled to the compensation circuit and the ADC and configured to generate a second digital code according to the compensation code and the first digital code; and a control circuit coupled to the amplifier circuit and the adder circuit and configured to generate the control signal according to the second digital code.

2. The signal receiving circuit of claim 1, wherein the compensation code is used to compensate a direct current (DC) offset of the ADC.

3. The signal receiving circuit of claim 1 further comprising:

a high-pass filter (HPF) coupled to the filter circuit and configured to filter the filtered signal to filter out at least one of a direct current (DC) offset of the RF front-end circuit and a DC offset of the filter circuit.

4. The signal receiving circuit of claim 3, wherein the HPF comprises:

a capacitor having a first end and a second end, wherein the first end is coupled to the filter circuit, and the second end is coupled to the amplifier circuit; and a resistor having a third end and a fourth end, wherein the third end is coupled to the amplifier circuit, and the fourth end is coupled to a reference voltage.

5. The signal receiving circuit of claim 1, wherein the compensation circuit further determines a look-up table according to a piece of temperature information, and the compensation circuit uses at least one of the control signal and the gain as an index to obtain the compensation code from the look-up table.

6. A method of calibrating a signal receiving circuit, wherein the signal receiving circuit comprises an amplifier circuit and an analog-to-digital converter (ADC), the ADC is configured to convert an output signal of the amplifier circuit to generate a first digital code, the method comprising:

generating a control signal according to a second digital code, the control signal being used to control a gain of the amplifier circuit;

generating a compensation code according to at least one of the control signal and the gain; and generating the second digital code according to the compensation code and the first digital code.

7. The method of claim 6, wherein the compensation code is used to compensate a direct current (DC) offset of the ADC.

8. The method of claim 6, wherein the signal receiving circuit further comprises a radio frequency (RF) front-end circuit and a filter circuit, the filter circuit generates a filtered signal, the method further comprising:

filtering out at least one of a direct current (DC) offset of the RF front-end circuit and a DC offset of the filter circuit by high-pass filtering the filtered signal before the amplifier circuit amplifies the filtered signal.

9. The method of claim 6 further comprising:

determining a look-up table according to a piece of temperature information;

wherein at least one of the control signal and the gain is an index of the look-up table, and the compensation code corresponds to the index.

\* \* \* \* \*